United States Patent [19]
Pramanick et al.

[11] Patent Number: 6,008,098
[45] Date of Patent: *Dec. 28, 1999

[54] ULTRA SHALLOW JUNCTION FORMATION USING AMORPHOUS SILICON LAYER

[75] Inventors: Shekhar Pramanick, Fremont; Che-Hoo Ng, San Martin, both of Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/726,113

[22] Filed: Oct. 4, 1996

[51] Int. Cl.$^6$ .................................................. H01L 21/336
[52] U.S. Cl. ............................................ 438/305; 438/528
[58] Field of Search ................................ 437/24, 41, 162, 437/931, 27; 438/527–529, 303, 305

[56] References Cited

U.S. PATENT DOCUMENTS

| | | | |
|---|---|---|---|
| 4,683,645 | 8/1987 | Naguib et al. | 437/41 |
| 5,393,687 | 2/1995 | Liang | 437/46 |
| 5,585,286 | 12/1996 | Aronowitz et al. | 437/24 |
| 5,610,088 | 3/1997 | Chang et al. | 438/305 |

FOREIGN PATENT DOCUMENTS 2-191341A  7/1990  Japan ...................... 437/24

*Primary Examiner*—Richard Booth
*Attorney, Agent, or Firm*—Skjerven, Morrill, MacPherson, Franklin, & Friel, LLP; Edward C. Kwok; Glen B. Choi

[57] ABSTRACT

A method of achieving shallow junctions in a semiconductor device is achieved by providing an amorphous silicon layer over an epitaxial layer, implanting ions into the amorphous silicon layer, and annealing the resulting device to recrystallize the amorphous silicon layer and drive in the implanted ions to a shallow depth less than the depth of the amorphous silicon layer.

15 Claims, 4 Drawing Sheets

ULTRA SHALLOW JUNCTION FORMATION USING AMORPHOUS SILICON LAYER

FIELD OF THE INVENTION

This invention relates to semiconductor devices, and more particularly to a method for forming shallow junctions therein.

BACKGROUND OF THE INVENTION

As is well known, in a typical MOS transistor, source and drain of one conductivity type are formed in a body of opposite conductivity type. As devices continually shrink in size, in order for such devices to operate in the correct electrical mode, it is necessary that the depth of the source and drain in the body, i.e., the junction depth, be reduced also. For example, presently, with a polysilicon gate width of, for example, 0.25 $\mu$, junction depth should be on the order of 800Å.

Typically, in the prior art, achievement of such a small junction depth is problematical, in particular, for example with a p+ region formed using boron ions, as will now be described with regard to formation of said regions in a silicon crystalline layer.

In general, such boron ions are implanted with a chosen energy and a particular dosage necessary to control the concentration. The energy will determine the eventual depth of the junction. With boron being a very light element, in order to attempt to achieve a very shallow junction, it must be implanted at a very low energy. For example, 5 KeV is typically minimum energy for the boron implant.

It has been found, however, that during dopant activation anneal, boron diffusion in the crystalline silicon layer is significantly large, so that the junction depth of the boron tends to be much deeper than planned.

The problem of undefined dopant junction depth occurs because the implantation of the boron ions into the monocrystalline silicon layer causes implantation damage, in turn causing interstitial atoms of silicon to exist, i.e., atoms not in the crystal lattice but between lattice atoms. That is, silicon atoms are displaced from the monocrystalline lattice and are sitting between silicon atoms in the monocrystalline lattice. It has been found that during the high temperature step (also known as dopant activation anneal) described above to diffuse the boron into the monocrystalline silicon layer, boron diffuses by attaching to these interstitial silicon atoms, causing a very rapid diffusion of the boron into the monocrystalline silicon layer. Thus, typically, when boron is implanted into monocrystalline silicon and then an anneal step is undertaken, the dopant profile extends well beyond that desired, for example, $X_j$ depth of 2000Å or more is formed. This is true even when implanting boron ions at a very low energy (i.e., ~5 KeV).

SUMMARY OF THE INVENTION

The present invention overcomes the above-cited problems by including the step of providing a layer of amorphous silicon over the top of the monocrystalline silicon layer. This amorphous silicon layer may be formed by implantation of, for example, germanium or silicon in the epitaxial layer. Subsequently, when boron ions are implanted into the amorphous silicon, interstitial atoms of silicon are not created because the amorphous silicon, being non-crystalline, does not define a crystal lattice. When the resulting structure is annealed, the boron ions are activated, meanwhile with the amorphous silicon becoming monocrystalline by solid phase epitaxy during this annealing step. By this method, $X_j$ depth can be controlled by choice of implant energy.

DESCRIPTION OF THE PREFERRED EMBODIMENTS

Figure 1:
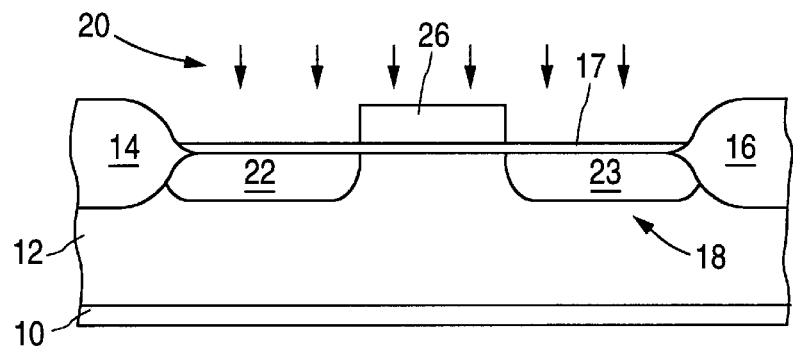
FIG. 1 is a cross-sectional view of a semiconductor device including an epitaxial layer, and showing the formation of an amorphous silicon layer.

Shown in FIG. 1 is an N+ type silicon substrate 10 having an N− type monocrystalline silicon layer 12 grown thereon as is well know, the doping being, for example, with arsenic or phosphorous. Field oxide regions 14, 16 and gate oxide layer 17 are provided in a well known manner, the oxide 17 overlying an active area 18 between the field oxide regions 14, 16. Polysilicon gate 26 is then formed over oxide layer 17. Next, germanium or silicon ions 20 are implanted at a respective dosage of $3E14CM^{-2}$ and $1E15CM^{-2}$ at, for example, 30 KeV (germanium) and 100 KeV (silicon). The energy is chosen to achieve amorphous silicon layer portions or regions 22, 23 approximately 2000Å thick, on top of the remaining monocrystalline silicon layer 12.

After formation of a gate oxide 24 from oxide layer 17, ions 28, for example, boron ions, are then implanted (FIG. 2), using an energy level of 5 KeV. The dosage may be on the order of $1E14CM^{-2}$ to $1E16CM^{-2}$.

It will be noted that because the layer portions 22, 23 are amorphous and not monocrystalline, interstitial silicon atoms are not being created during this process step. That is, silicon atoms are not situated between atoms in a crystal lattice because the entire layer portions 22, 23 are amorphous.

Next, the resulting structure is annealed at, for example, a temperature of 800° C. for a time period of 40 seconds (FIG. 3), causing the dopant to activate to form shallow, lightly doped source and drain regions 30, 32.

During the anneal step, the amorphous silicon layer portions 22, 23 recrystallize, growing the entire lattice up from the remaining monocrystalline silicon layer 12. As the recrystallization proceeds, the boron ions 28 drop into the crystal lattice sites to determine active junctions.

At the interface of the crystalline silicon layer 12 and the amorphous silicon layer portions 22, 23 formed as described above, implant defects may occur, generally just below the interface. In the past, attempts have been made to remove these defects by means of a high temperature processing step, but often this has been unsuccessful. In the present case, however, because the thickness of the amorphous silicon layer portions 22, 23 is approximately 2000Å or more, such defects occur approximately at that depth. The ultimate depth of the lightly doped source and drain regions 30, 32 are on the order of 700Å, i.e., substantially less than the thickness of the amorphous silicon layer portions 22, 23, so that the junction depth is not near the defects in the silicon.

Figure 4:
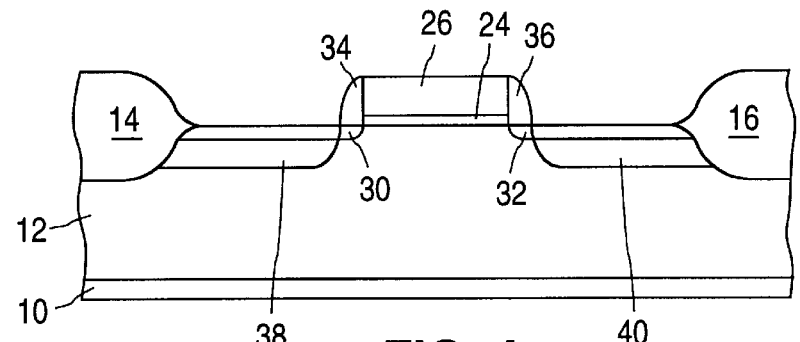
FIG. 4 is a view similar to that shown in FIG. 3, but showing the formed main portions of the source and drain.
Figure 5:
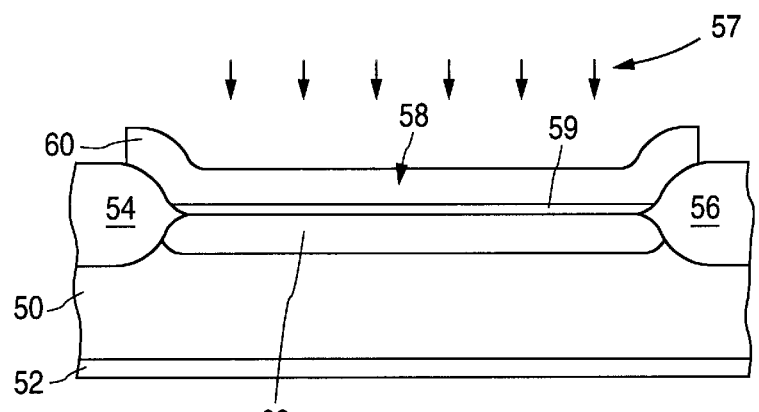
FIG. 5 is a cross-sectional view of a semiconductor device including an epitaxial layer, and showing the formation of an amorphous silicon layer.

With reference to FIG. 4, the device is further processed by providing spacers 34, 36 on opposite sides of the gate 24, 26, as is well known, and implanting and activating ions to form the main portions 38, 40 of the source and drain, which extended deeper than the lightly doped source and drain regions 30, 32.

Figure 2:
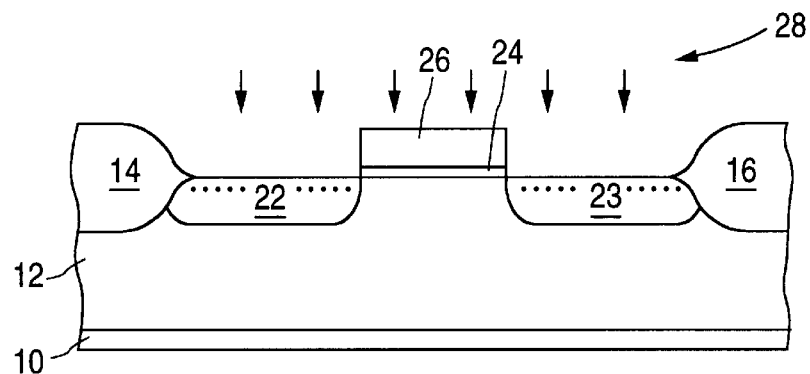
FIG. 2 is a view similar to that shown in FIG. 1, subsequent to formation of gate oxide and gate and showing the implant of ions.
Figure 3:
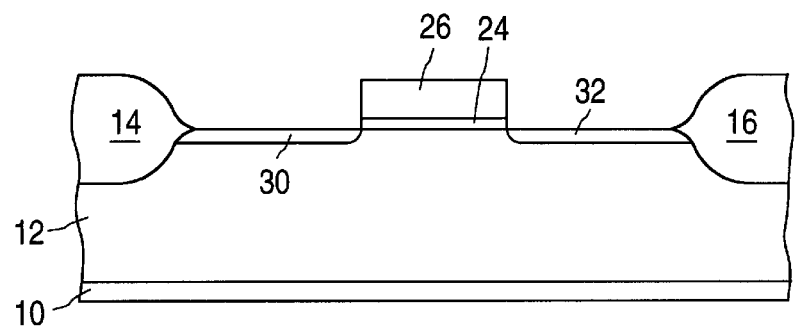
FIG. 3 is a view similar to that shown in FIG. 2, but showing the formation of the lightly doped source and drain of the device.

As an alternative, subsequent to achieving the structure of FIG. 1, the processing step as indicated in FIG. 4 can be undertaken immediately subsequent to that shown in FIG. 1, if so chosen. That is, subsequent to achieving the structure of FIG. 1, the spacers 34, 36 are provided on opposite sides of the gate structure 24, 26, and ions are implanted and activated to form the main portions 38, 40 of the source and drain. Subsequent thereto, the spacers 34, 36 are removed and the steps of FIGS. 2 and 3 are undertaken in sequence to form the desired device, with the low temperature anneal being undertaken at for example 800° C. for 40 seconds. With the process step of FIG. 4 being generally undertaken at a higher temperature than that of FIG. 3, this alternative procedure ensures that the higher temperature process step of forming the deep portions 38, 40 of the source and drain takes place prior to the lower temperature process step in forming the lightly doped regions 30, 32 of the source and drain, so that a subsequent high temperature process step can not have a detrimental effect on the formation of the regions 30, 32 of the source and drain.

It should be noted that the advantages of the invention are readily obtained not just in the situation where boron is implanted. Rather, other ions can with advantage be implanted, such as arsenic, phosphorous, or antimony.

Figure 6:
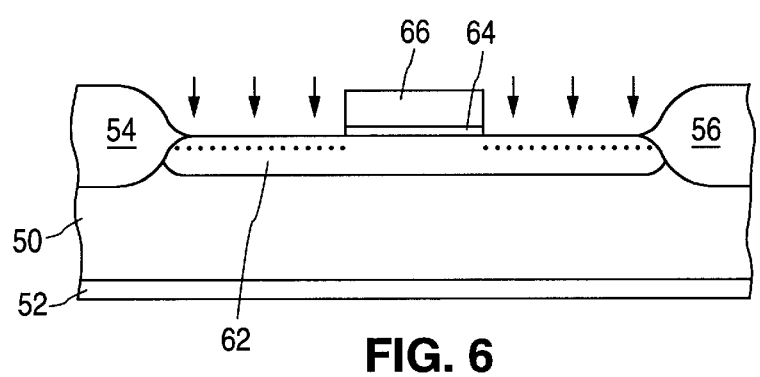
FIG. 6 is a sectional view similar to that shown in FIG. 5, but having the gate oxide and gate formed, and showing the implantation of ions.
Figure 7:
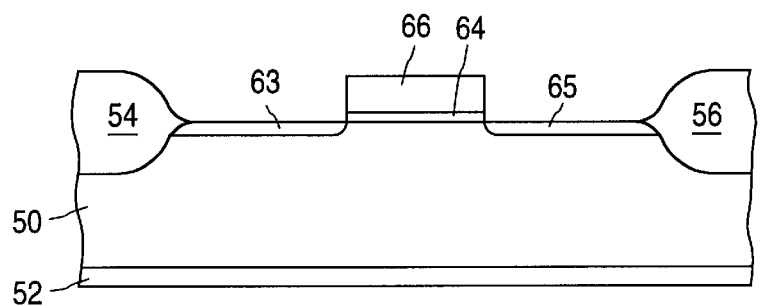
FIG. 7 is a view similar to that shown in FIG. 6, but showing the formed lightly doped drain and source regions.
Figure 8:
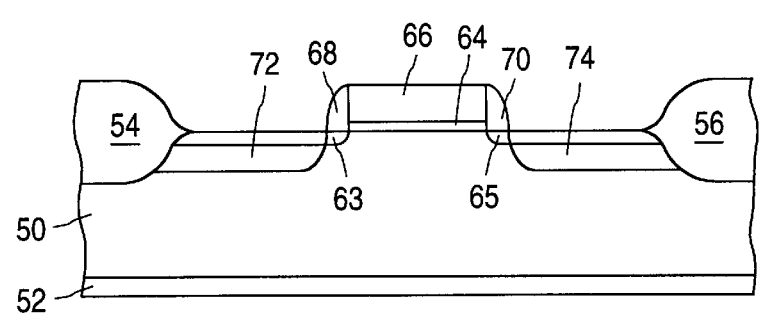
FIG. 8 is a view similar to that shown in FIG. 7, but showing the formed main portions of the source and drain.

A second embodiment of the invention is shown in FIGS. 5–8. With reference to FIG. 5, again, a monocrystalline silicon layer 50 is initially provided on a silicon substrate 52, as is well know. Field oxide regions 54, 56 are grown defining an active region 58, and a thin oxide layer 59 and a layer of polysilicon 60 are provided over the active region 58. Amorphous silicon layer 62 is formed, similar to that disclosed previously, by implantation of silicon or germanium ions 64 at an energy level of 100 KeV and at a dosage of $1E15CM^{-2}$, through the polysilicon layer 60 and oxide layer 59 to form amorphous silicon layer 62 directly beneath the oxide layer 59. Then, the oxide layer 59 and polysilicon layer 60 are patterned to form the gate oxide 57 and gate 66 of the device (FIG. 6). Subsequent thereto, the steps shown in FIGS. 6–8 are similar to those shown in FIGS. 2–4.

That is, subsequent to the implant step of FIG. 6, the boron is activated to form lightly doped source and drain regions 63, 65, and because that layer 62 is amorphous and not monocrystalline, interstitial silicon atoms are not being created during this process step. Thus, again, the problems disclosed above do not occur.

During the anneal step, the amorphous silicon layer 62 recrystallizes (FIG. 7), and similar to the previous embodiment, spacers 68, 70 are provided and the main regions 72, 74 of the source and drain are implanted and driven in as previously described.

Figure 9:
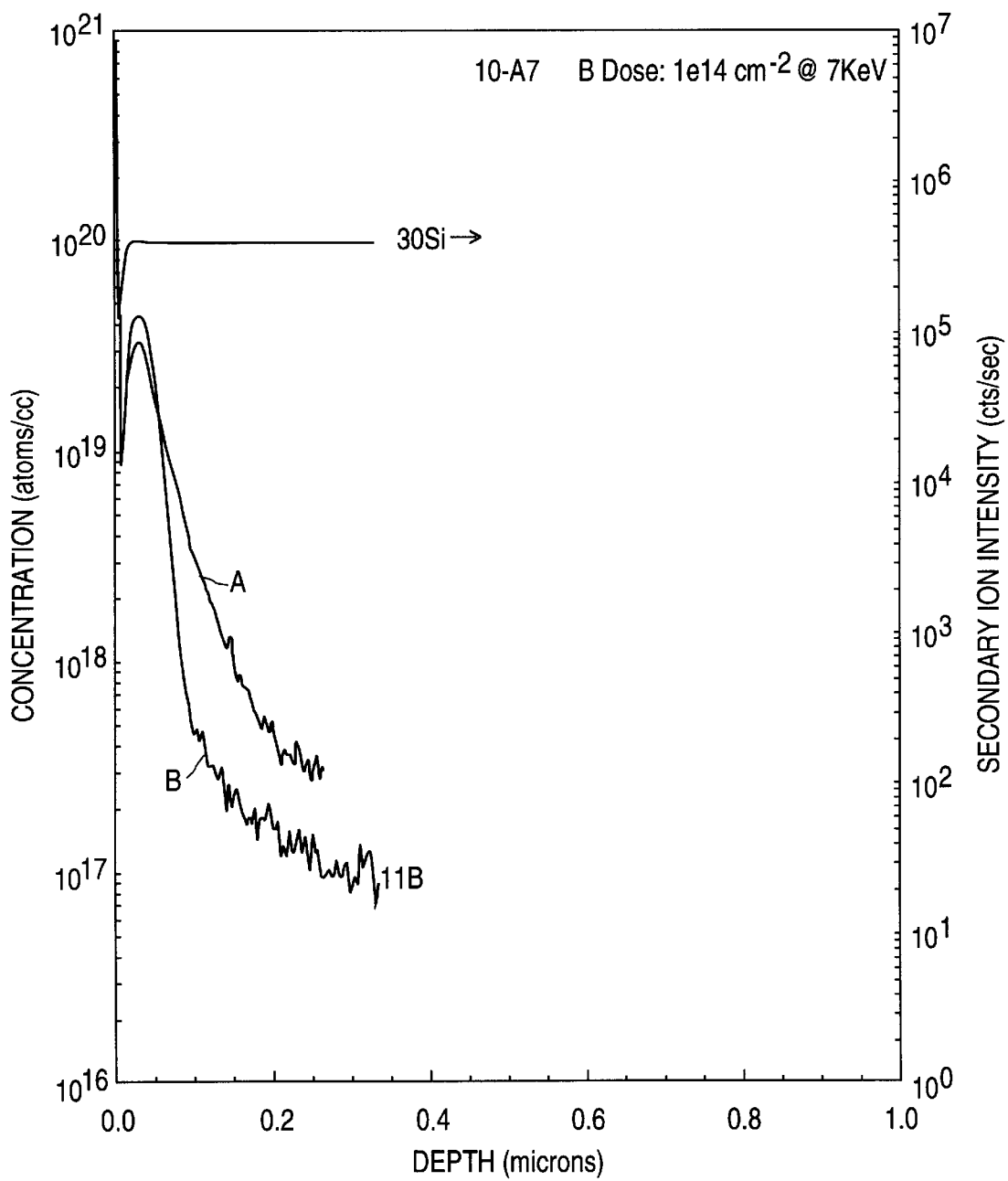
FIGS. 9 and 10 are graphs of dopant depth vs. dopant concentration, showing embodiment of invention at boron dose of $1E14CM^{-2}$ and $3E14CM^{-2}$ respectively.

FIG. 9 is a plot of depth versus concentration of boron ions forming the lightly doped source and drain regions, undertaken with a boron implant dosage of $1E14CM^{-2}$ at 7 KeV. The curve A shows such parameters for the standard or conventional process while the curve B shows the parameters of the inventive process disclosed in FIGS. 1–4 and 5–8. As will be noted, in the standard process, the concentration of the boron ions falls off to a low level at about the 1500Å depth range, meanwhile providing a sheet resistivity of 1682 $\Omega/\square$, while the concentration in the method of FIGS. 1–4 and 5–8 falls off even more rapidly to a low level at in the range of 800Å depth, providing a sheet resistivity of 617$\Omega/\square$ which is substantially lower than the conventional process.

Figure 10:
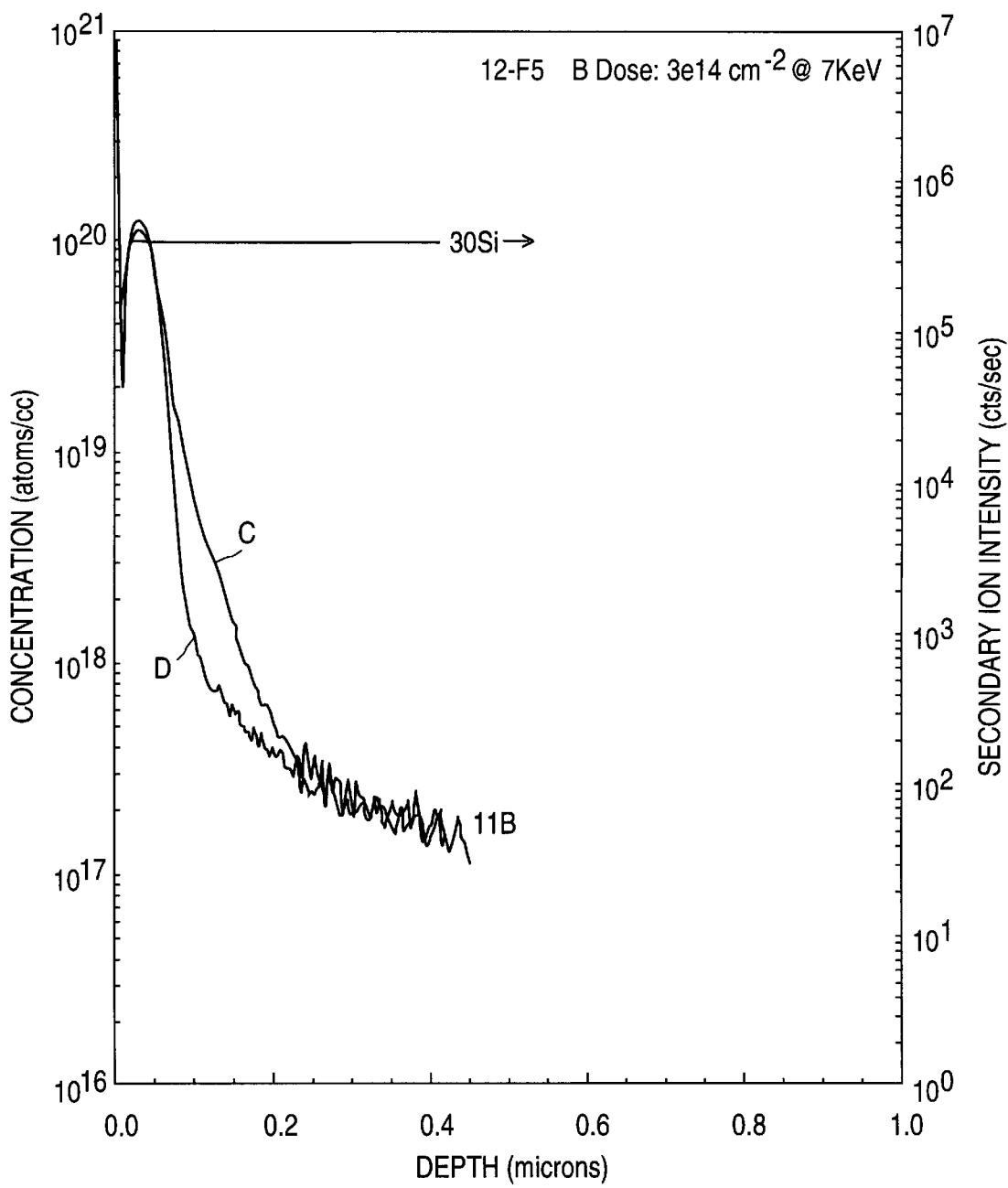

FIG. 10 is a graph similar to that of FIG. 9, but undertaken with a boron implant dosage of $3E14CM^{-2}$ at 7 KeV. The curve C shows such parameters for the conventional process while the curve D shows the parameters of the inventive process disclosed in FIGS. 1–4 and 5–8. In this case, $X_j$ depth is ~1700Å for the conventional process whereas in the inventive process disclosed $X_j$ depth of 1000Å is indicated. In this case, with sheet resistivities of 1392 $\Omega/\square$ and 207 $\Omega/\square$ for the respective conventional process and inventive process, a significant reduction in sheet resistivity is achieved.

It will be seen that because of the particular methods described, and in particular because of the inclusion of an amorphous silicon layer which avoids the problems of the creation of interstitial silicon atoms, the diffusion of light atoms such as boron takes place slowly and in a highly controlled manner so that junction depths of a very small dimension can be achieved, in furtherance of the desires of the industry. In addition, the amorphous layer is chosen to be sufficiently thick so that the achieved junction depths of the lightly doped source and drain do not reach the defect area which is close to the interface of the amorphous silicon layer and remaining epitaxial layer.

We claim:

1. A method of fabricating a semiconductor device comprising:

providing a silicon body;

providing an insulator layer over the silicon body;

providing a conductor material over the insulator layer to form a gate electrode over the silicon body;

providing an amorphous silicon layer of a predetermined depth at the surface of the silicon body, wherein the act of providing an amorphous silicon layer follows the act of providing a conductor material;

providing spacers on the insulator adjacent the gate electrode;

using the gate electrode and the spacers as masking material, introducing a first impurity into the silicon body through the insulator layer;

removing said spacers;

providing a second impurity in the amorphous silicon layer; and diffusing the second impurity in the amorphous silicon layer into to a depth less than said predetermined depth.

2. The method of claim 1 and further providing that the amorphous silicon layer becomes crystalline.

3. The method of claim 1 wherein the step of providing the second impurity in the amorphous silicon layer comprises implanting ions in the amorphous silicon layer.

4. The method of claim 1 wherein the step of diffusing the second impurity comprises annealing.

5. The method of claim 2 wherein the step of providing that the amorphous silicon layer becomes crystalline comprises annealing.

6. The method of claim 1 wherein the step of providing a second impurity in the amorphous silicon layer comprises providing boron ions in the amorphous silicon layer.

7. The method of claim 1 wherein the step of providing a second impurity in the amorphous silicon layer comprises providing arsenic ions in the amorphous silicon layer.

8. The method of claim 1 wherein the step of providing a second impurity in the amorphous silicon layer comprises providing phosphorous ions in the amorphous silicon layer.

9. The method of claim 1 wherein the step of providing a second impurity in the amorphous silicon layer comprises providing antimony ions in the amorphous silicon layer.

10. A method of fabricating a semiconductor device comprising:

providing a silicon body;

providing an oxide layer over the silicon body;

providing a polysilicon layer over the oxide layer;

implanting ions through the polysilicon layer, oxide layer and into the silicon body to form an amorphous silicon layer of a predetermined depth under the oxide layer;

patterning the polysilicon layer and oxide layer to form a gate electrode and to expose a portion of the amorphous silicon layer;

providing oxide spacers adjacent to the gate electrode;

using the gate electrode and the oxide spacers as masking material, introducing a first impurity into the silicon body;

removing said oxide spacers;

implanting a second impurity into the amorphous silicon layer; and diffusing the second impurity implanted in the amorphous silicon layer to a depth less than said predetermined depth.

11. The method of claim 10 wherein the step of diffusing the second impurity implanted into the amorphous silicon layer comprises an annealing step to cause the second impurity implanted into the amorphous silicon layer to diffuse and to cause the amorphous silicon layer to become crystalline.

12. The method of claim 10 wherein the step of implanting a second impurity into the amorphous silicon layer comprises implanting boron ions in the amorphous silicon layer.

13. The method of claim 10 wherein the step of implanting a second impurity into the amorphous silicon layer comprises implanting arsenic ions into the amorphous silicon layer.

14. The method of claim 10 wherein the step of implanting a second impurity into the amorphous silicon layer comprises implanting phosphorous ions into the amorphous silicon layer.

15. The method of claim 10 wherein the step of implanting a second impurity into the amorphous silicon layer comprises implanting antimony ions into the amorphous silicon layer.

* * * * *